(12) United States Patent
Burzynski et al.

(10) Patent No.: US 6,344,297 B1
(45) Date of Patent: Feb. 5, 2002

(54) HOLOGRAPHIC RECORDING MATERIAL

(75) Inventors: Ryszard Burzynski, Kenmore; Deepak N. Kumar, Tonawanda; Saswati Ghosal, Amherst, all of NY (US); Dale R. Tyczka, Lansdale, PA (US)

(73) Assignee: Laser Photonics Technology Inc., W. Amherst, NY (US)

( * ) Notice: Subject to any disclaimer, the term of this patent is extended or adjusted under 35 U.S.C. 154(b) by 0 days.

(21) Appl. No.: 09/415,984

(22) Filed: Oct. 12, 1999

(51) Int. Cl.$^7$ ................................................. G03H 1/04
(52) U.S. Cl. ..................................... 430/2; 430/1; 359/3
(58) Field of Search ................................. 430/1, 2, 945; 359/1, 3; 522/48

(56) References Cited

U.S. PATENT DOCUMENTS

| | | | | |
|---|---|---|---|---|
| 2,951,758 A | * | 9/1960 | Notley et al. | 522/48 |
| 3,658,526 A | * | 4/1972 | Haugh et al. | 430/1 |
| 4,145,216 A | * | 3/1979 | Merrill et al. | 96/28 |
| 4,286,048 A | * | 8/1981 | Merrill et al. | 430/284 |
| 4,815,800 A | * | 3/1989 | Chern et al. | 350/3.7 |
| 4,959,283 A | * | 9/1990 | Smothers et al. | 430/1 |
| 4,983,003 A | * | 1/1991 | Wreede et al. | 350/3.61 |
| 5,260,149 A | * | 11/1993 | Monroe et al. | 430/1 |
| 5,500,912 A | * | 3/1996 | Alonas et al. | 385/37 |
| 5,707,773 A | * | 1/1998 | Grossman et al. | 430/281.1 |

FOREIGN PATENT DOCUMENTS

| | | | |
|---|---|---|---|
| WO | WO97/10527 | * | 3/1997 |
| WO | WO98/12607 | * | 3/1998 |

OTHER PUBLICATIONS

Steckman et al., "Characterization of phenanthrenequinone–doped poly(methyl methacrylate) for holographic memory," Optics Letters, vol. 23, No. 16/Aug. 15, 1998, pp. 1310–1312.

Bains, "Researchers on both coasts eye hologram recording scheme—Material raises hopes for Tbyte storage," EETIMES, Issue 1012, Jun. 15, 1998, pp. 1–4.

Steckman, "Polymer Based Recording Materials," optics.caltech.edu/steckman/Polymer/Polymer.html, pp. 1–2 May 8, 1998.

Steckman, "PQ Doped PMMA," optics.caltech.edu/steckman/Polymer/PMMA PQ/PMMA PQ.html, p. 1 May 8, 1998.

Veniaminov et al., "Hologram amplification by diffusion detstruction of out–of–phase periodic structures," Opt. Spektrosk, 70, Apr. 1991, pp. 505–508.

Ludman et al., "Holographic Nonspatial Filter," SPIE vol. 2532, pp. 481–490 (1995).

Popov et al., "Photochemical and diffusional apodization of high–efficiency thick phase holograms," SPIE vol. 2215 Photonics for Space Environments II (1994), pp. 64–71.

Barbastathis, "Shift Multiplexed Holographic 3D Disks," sunoptics.caltech.edu/~george/shift_multiplexing.html, pp. 1–4 Aug. 26, 1998.

* cited by examiner

Primary Examiner—Martin Angebranndt
(74) Attorney, Agent, or Firm—Hodgson Russ LLP

(57) ABSTRACT

New photosensitive acrylic material compositions for fabrication of holographic recording materials (HRMs) are provided. These compositions are comprised of polymerizable acrylic monomers and light absorbing dyes, and when polymerized they are thermally stable, light sensitive, hard and inert to common chemicals. Methods of fabricating HRMs with symmetric concentration distribution of the dye are also provided.

11 Claims, No Drawings

HOLOGRAPHIC RECORDING MATERIAL

FIELD OF THE INVENTION

The present invention relates to holographic recording materials (HRMs) having a polymer matrix and a light harvesting dye.

BACKGROUND OF THE INVENTION

The fundamental aspect of an HRM is to utilize a photochemical phenomenon wherein the light harvesting dye absorbs light, reacts with the polymer matrix, and alters the index of refraction. These induced refractive index modulations result in phase holograms with high diffraction efficiency and angular selectivity. Previous HRMs are well known, but the HRM closest to the subject invention is limited to a poly(methyl methacrylate) (PMMA) polymer and a light harvesting dye, 9,10-phenanthrenequinone composite.

For example, A. Popov et al. (A. P. Popov, A. V. Veniaminov, Y. N. Sedunov, *SPIE* 2215, 64, 1994) describe a general method of fabricating a 6 to 8 mm thick HRM having a gradient distribution of the 9,10-phenanthrenequinone dye in the PMMA matrix across the material's thickness. The highest dye concentration is in the center of the HRM's cross-section and the lowest at each surface. This variation of the dye concentration is achieved by exposing each surface to a mercury lamp light filtered in such a way that the transmission maximum coincides with having a wavelength within the absorption profile of 9,10-phenanthrenequinone dye. As the light propagates through the HRM, its intensity falls exponentially with the penetration depth in accordance with the Lambert-Beer law. The accompanying photoinduced effect, a reaction between the dye and the polymer matrix, decreases. Thereby, unreacted dye is located toward the center of the HRM's cross-section.

In the same publication, Popov et al. describe another method of fabricating a thick HRM with a gradient distribution of the 9,10-phenanthrenequinone dye in a PMMA matrix. In this method, the initial 100 micrometers thick layer of PMMA polymer is doped with 10 wt % of 9,10-phenanthrenequinone, which was prepared from a dichloroethane solution. The dried film was then placed between two 3 mm thick pure PMMA slabs and entire assembly pressed together and heated to accelerate dye diffusion from the center layer to outside layers. The diffusion into the PMMA slabs depends on the temperature. In most instances, the temperature exceeds the PMMA's glass transition temperature. Obviously, this result is not desired.

Likewise, B. Ludman et al. (J. E. Ludman, N. O. Reinhard, I. V. Semenova, Yu. L. Korzinin, and S. M. Sahriar, *SPIE* 2532, 481, 1995) describe the use of a HRM consisting of 0.5 to 5 wt % of 9,10-phenanthrenequinone in a PMMA matrix. This HRM has similar problems of Popov et al.

Similarly, C. Steckman et al. (G. J. Steckman, I. Solomatine, G. Zou and D. Psaltis, *Opt. Lett.* 23, 1310, 1998) describe the preparation of a 1 to 5 mm HRM comprising 0.7 wt % of 9,10-phenanthrenequinone dye dissolved in a PMMA matrix. To prepare such material, a solution of the dye, a polymerization initiator, and methyl methacrylate, is poured into molds and allowed to polymerize in a pressure chamber at elevated temperatures.

A problem with these prior references is that the PMMA has a relatively low glass transition which can lead to distortions after light exposure. Another problem is that post exposure treatment at elevated temperatures (around and above the glass transition temperature), significantly reduces the photoinduced index modulation by the diffusion of the photoproducts and, consequently, the strength of the holograms substantially decreases. Another problem relates to the low number of reactive sites in the polymer matrix during holographic recording. Yet another problem involves the limited chemical inertness of the PMMA matrix toward common chemical agents such as alcohols, and acetone.

SUMMARY OF THE INVENTION

The problems of these references can be solved with the present invention. The present invention provides high optical quality HRMs with high holographic storage capacity, thermal stability at elevated temperatures, hardness and inertness toward chemical agents. The present invention is directed to a HRM having at least two distinct acrylate materials and a light harvesting dye. Along with this composition, the present invention is directed to a new method of producing HRM with gradient distribution of the light harvesting dye. This new method results in a HRM with better angular selectivity and optical quality (low scattering).

DETAILED DESCRIPTION OF THE INVENTION

The present invention is a HRM having at least two distinctive acrylate materials and a light harvesting dye, wherein the acrylate materials polymerize. The term "distinctive" means the acrylate material has a secondary carbon chain of a different length. Moreover, each acrylate material is a monomer represented by the structural formulas 1 to 4.

Formula 1 has the following structure:

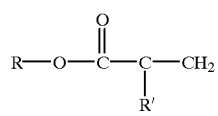

wherein R'=H; or an alkyl group, substituted or unsubstituted, having 1 to 8 carbon atoms; or an aryl group, substituted or unsubstituted, having 4 to 20 carbon atoms; and R=an alkyl group, substituted or unsubstituted, having 1 to 8 carbon atoms; or an aryl group, substituted or unsubstituted, having 4 to 20 carbon atoms.

Formula 2 has the following structure:

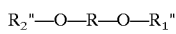

wherein R=an alkyl group, substituted or unsubstituted, having 1 to 8 carbon atoms; or an aryl group, substituted or unsubstituted, having 4 to 20 carbon atoms; and $R_1"$ and $R_2"$=—OC(=O)C($R_3$)=$CH_2$ or H wherein $R_3$=H; or an alkyl group, substituted or unsubstituted, having 1 to 8 carbon atoms; or an aryl group, substituted or unsubstituted, having 4 to 20 carbon atoms.

Formula 3 has the following structure:

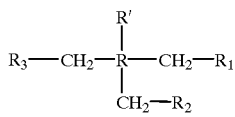

wherein R=a tri- or tetra-substituted aryl group; or a carbon atom;

R'=H; or an alkyl group, substituted or unsubstituted, having 1 to 8 carbon atoms; or an aryl group, substituted or unsubstituted, having 4 to 20 carbon atoms; and $R_1$, $R_2$, and $R_3$=—OC(=O)C($R_4$)=$CH_2$ or H
  wherein $R_4$=H; or an alkyl group, substituted or unsubstituted, having 1 to 8 carbon atoms; or an aryl group, substituted or unsubstituted, having 4 to 20 carbon atoms.

Formula 4 has the following structure:

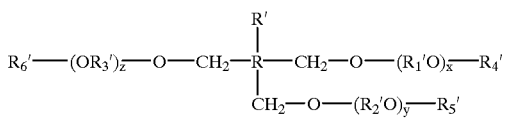

wherein R=a tri- or tetra-substituted aryl group; or a carbon atom;

R'=H; or an alkyl group, substituted or unsubstituted, having 1 to 8 carbon atoms; or an aryl group, substituted or unsubstituted, having 4 to 20 carbon atoms;

$R_1'$=$R_2'$=$R_3'$=—$CH_2CH$— or —$CH_2CH_2CH_2$—, and $R_4'$=$R_5'$=$R_6'$=—OC(=O)C($R_7'$)=$CH_2$ or H
  wherein $R_7'$=H; or an alkyl group, substituted or unsubstituted, having 1 to 8 carbon atoms; or an aryl group, substituted or unsubstituted, having 4 to 20 carbon atoms.

The light harvesting dye can be a compound or a mixture of two or more dye compounds. The dye compounds must, however, contain at least one of the following structures, labeled as Formulas 5 and 6.

Formula 5 has the following structure:

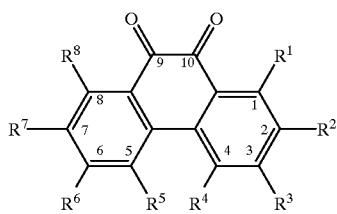

wherein $R^1$, $R^2$, $R^3$, $R^4$, $R^5$, $R^6$, $R^7$, $R^8$ is an H, $R^9$, or X;

$R^9$ is an alkyl group, substituted or unsubstituted, having 1 to 8 carbon atoms, or an aryl group, substituted or unsubstituted, having 4 to 20 carbon atoms; and X is a halogen.

And Formula 6 has the following structure:

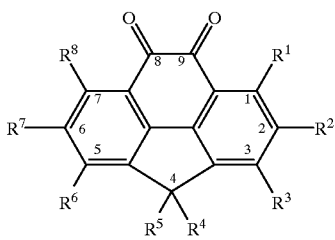

wherein $R^1$, $R^2$, $R^3$, $R^4$, $R^5$, $R^6$, $R^7$, $R^8$, is an H, $R^9$, or X;

$R^9$ is an alkyl group, substituted or unsubstituted, having 1 to 8 carbon atoms, or an aryl group, substituted or unsubstituted, having 4 to 20 carbon atoms;

X is a halogen;

When the acrylate materials are polymerized, the polymerized acrylate remains thermally stable at elevated temperatures (about 170° C.), inert toward common chemicals, hard, and light sensitive.

The acrylate materials form a polymer matrix by a free radical polymerization. For this invention to perform as desired, each "at least two distinctive polymerizable acrylic materials" must be distinctive, as defined above. Accordingly, the acrylate materials can be selected from the monoacrylic monomers of Formula 1, the diacrylic monomers represented by Formula 2, or the triacrylic monomers represented by Formulas 3 and 4, or any combination thereof. Preferred monomers are those illustrated in Formulas 7 to 11. These Formulas are as follows:

Formula 7 is methyl methacrylate and has the following structure:

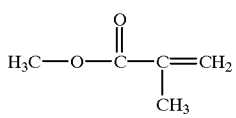

Formula 8 is 1,2-ethanediol dimethacrylate (EGDM) and has the following structure:

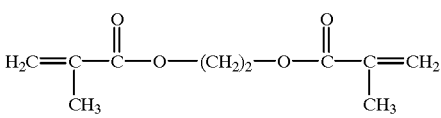

Formula 9 is trimethylolpropane trimethacrylate (TMPTMA) and has the following structure:

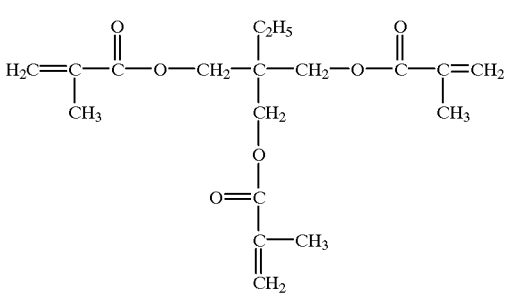

Formula 10 is trimethylolpropane ethoxylate triacrylate (TMPETA) and has the following structure:

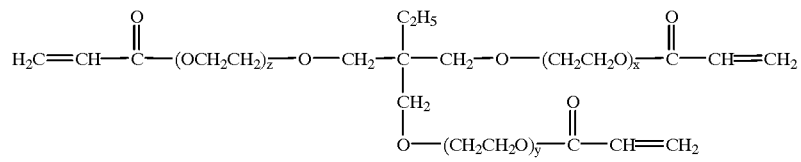

$x + y + z = n = 7$

Formula 11 is trimethylolpropane propoxylate triacrylate (TMPPTA) and has the following structure:

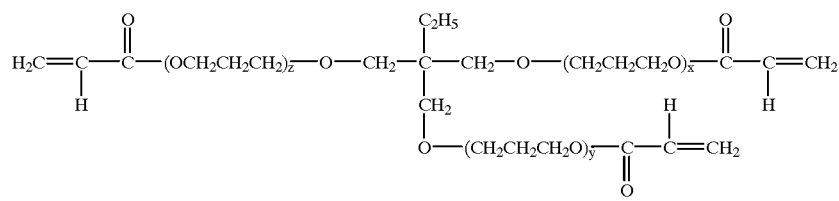

$x + y + z = n = 6$

Whichever two or more distinct acrylate monomers are selected, the preferred ratio between the "at least two distinctive acrylate monomers" ranges from 1:99 percent by weight to 99:1 percent by weight, and preferably the range is 5:95 and 95:5 weight percent. This mixture of "at least two distinctive acrylate monomers" dissolves the "at least one light harvesting dye." The dye material is selected from the Formulas 5 and 6, or any combination thereof. Preferably, the dye material has one of the following formulas.

Formula 12 is 9,10-phenanthrenequinone and has the following structure:

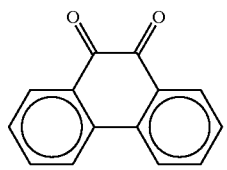

Formula 13 is 2-methyl-9,10-phenanthrenequinone and has the following structure:

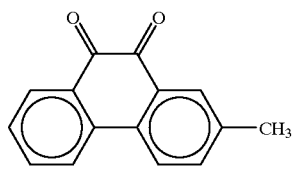

Formula 14 is 2,7-dimethyl-9,10-phenanthrenequinone and has the following structure:

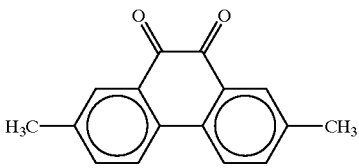

Formula 15 is 4,5-dimethyl-9,10-phenanthrenequinone and has the following structure:

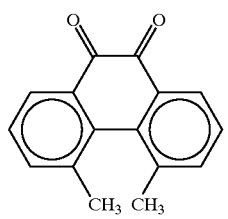

Formula 16 is 2,4,5,7-tetramethyl-9,10-phenanthrenequinone and has the following structure:

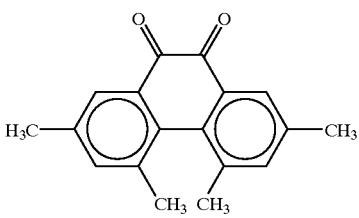

Formula 17 is 4H-cyclopenta[def]phenanthrene-8,9-dione and has the following structure:

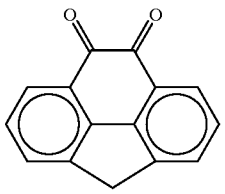

Formula 18 is 4,4-dimethylcyclopenta[def]phenanthrene-8,9-dione and has the following structure:

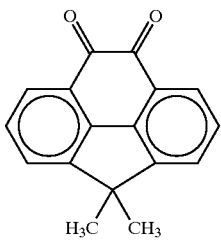

The concentration of the light harvesting dye in the monomer mixture is less than 6 weight percent of the monomer mixture and greater than 0.1 weight percent of the monomer mixture, preferably between 0.4 and 5 weight percent.

Turning to the methods to prepare a HRM, the present invention sets forth three methods. Each method is a free-radical polymerization method of the two distinctive acrylate materials. The polymerization can be accomplished by adding a polymerization initiator to the monomer mixture. Examples of a polymerization initiator are benzoyl peroxide and 2,2'-azobis(2-methylpropionitrile) (AIEN). The initiator concentration ranges between up to 1 percent by weight of the monomer mixture, preferably 0.2 to 1 percent.

First Method:

The first method is directed to producing a HRM with a uniform distribution of dye. This method requires inserting a HRM Mixture within a polymerization cell. An HRM Mixture has the monomer mixture of at least two distinct acrylate materials, the polymerization initiator, and one or more light harvesting dyes. And the polymerization cell is two sheets of glass, preferably of optical flatness, separated by a gasket. The gasket is flexible and contains the HRM mixture between the sheets of glass. The polymerization cell is held together by a force, like a clamp.

Once the HRM Mixture is within the polymerization cell, the HRM Mixture is polymerized. The polymerization occurs at different temperatures during various time periods. For example, the temperature is typically held between the ranges of 60° C. to 170° C., and every temperature in between. If the temperature is at 60° C., the polymerization is not as complete as if the temperature were 170° C. Moreover, the time period can range from 2 hours to 24 hours, and every period of time in between. Accordingly, if the temperature is low and the time period is short, then the polymerization of the HRM material is not as complete as if the temperature was high and the time period long.

To obtain a hard, stable HRM with a uniform distribution of dye throughout the HRM, the HRM Mixture is polymerized at a high temperature and a long time period.

Second Method:

The second method is directed to a non-uniform distribution of the dye throughout the HRM. To obtain this non-uniform distribution of the dye in HRM, the HRM is divided into at least three layers. The first layer is the inner layer. The inner layer is the HRM of the first method, except the HRM is not fully polymerized. This inner layer is then inserted into a polymerization cell, wherein there are cavities between the exterior surface of the inner layer and the polymerization cell. A third acrylate material is inserted into each cavity to form outer layers. The third acrylate material can be any monomer or combination of monomers used in the "at least two distinctive acrylate materials" of the inner layer. Moreover, the third monomer can be the same or different monomer as the "at least two distinctive acrylate materials."

Like the first method, the polymerization process occurs in the same manner. The only difference is that the dye is not uniformly distributed throughout the HRM. Rather the dye is eventually distributed into a symmetrical concentration distribution, approximating an exponential distribution, wherein the concentration of the dye is greatest in the center of the HRM and the least concentrated at the edges.

Third Method

The third method is a variation of the first and second methods. The third method has two outer layers and an inner layer. The two outer layers comprise at least one monomer selected from the above-identified acrylate materials, and a polymerization initiator. The outer layers are formed in the same steps as the inner layer of the second method (not fully polymerized).

The two outer layers are placed into a polymerization cell wherein the exterior side of each outer layer contact the interior side of the polymerization cell. Moreover, there is a cavity between the interior side of each outer layer. The HRM Mixture is inserted into the cavity. Like the first method, the polymerization process occurs in the same manner. And like the second method, the dye is distributed into a symmetrical concentration distribution, like an exponential distribution, wherein the concentration of the dye is greatest in the center of the HRM and the least concentrated at the edges.

EXAMPLE 1

A holographic recording sample in the form of a disc having a diameter 5 inches and a thickness of 1/12 inch was fabricated through the polymerization of a solution containing 216 mg of a light harvesting compound, 2-methyl-9,10-phenanthrenequinone dye in commercially available high grade methyl methacrylate (MMA) monomer in the amount of 23.2 g and 1,2-ethanediol dimethacrylate (EGDM) in the amount 7.52 g using 61.4 mg of benzoyl peroxide as the initiator inside a room, preferably lighted of wavelengths longer than 590 nm. The monomers, preferably dry, are preferably first passed through a column with the inhibitor remover to remove the inhibitor.

A desired amount of the 2-methyl-9,10-phenanthrenequinone dye and the initiator in the amount of 0.2 weight percent of the monomers is dissolved in a known amount of monomer mixture and the solution is filtered into a dust free bottle. Such prepared solution is injected into specially prepared molds. The mold consists of high quality optical glass flats separated by a flexible gasket that defines the final thickness of the sample, and also forms the confining wall of the mold. The optical flats are held together in place using pressure clamps. After filling, the molds are placed in an oven at 60° C. After 24 hours temperature of the oven is raised to 90° C. and the samples are held at that temperature for 12 hours. Finally, temperature is raised to 150° C. and the sample is held at this temperature for 3 hours.

EXAMPLE 2

A holographic recording sample in the form of a disc having a diameter of 5 inches and a thickness of 1/12 inch was fabricated through the polymerization of a solution containing 216 mg of a light harvesting compound, 9,10-phenanthrenequinone dye in commercially available high grade methyl methacrylate (MMA) monomer in the amount of 23.2 g and 1,2-ethanediol dimethacrylate (EGDM) in the amount 7.52 g using 61.4 mg of AIBN as the initiator. The solution is filtered and injected into the molds and kept for polymerization at 60° C. in an oven. The polymerization mold is as described in the Example 1. The subsequent thermal processing is as in Example 1.

EXAMPLE 3

A trifunctional methacrylate monomer, trimethylolpropane trimethacrylate (TMPTMA) is used along with MMA to form highly crosslinked holographic recording system containing the light harvesting dye 9,10-phenanthrenequinone. A holographic recording sample in the form of a disc of diameter 5 inches and thickness 1/12 of an inch was fabricated through the polymerization of a solution containing 216 mg of a light harvesting compound, 9,10-phenanthrenequinone dye in commercially available high grade methyl methacrylate (MMA) monomer in the amount of 23.2 g and cross-linking monomer trimethylolpropane trimethacrylate (TMPTMA) in the amount 7.52 g using 61.4 mg of benzoyl peroxide as the initiator.

The fabrication procedure used for the TMPTMA crosslinked sample is similar to that described in Example 1 except that the crosslinked samples are additionally processed at temperature of 170° C. for 3 hours to complete the cross-linking process. The fully crosslinked samples are thermally very stable, are scratch resistant and resistant to most organic solvents.

EXAMPLE 4

A commercially available triacrylate monomer, trimethylolpropane ethoxylate triacrylate (TMPETA), and methyl methacrylate in a weight ratio 25% to 75% are used to fabricate high sensitivity holographic recording samples. A high sensitivity HRM of diameter 5 inches and thickness 1/12 th of an inch is made by polymerizing mixture of 7.52 g of TMPETA triacrylate monomer and 23.2 g of methyl methacrylate monomer containing 216 mg of 9,10-phenanthrenequinone dye. The amount of benzoyl peroxide initiator is 0.2% by weight of the monomer mixture. Polymerization process is as described in Example 3.

EXAMPLE 5

The apodized HRM (medium with symmetric concentration distribution of the dye) is created by introducing a gradient, preferably exponential, distribution in the concentration of the light harvesting dye in the polymer matrix. The concentration of the light harvesting dye molecules is maximum midway through the sample's cross-section and slowly decreases to zero on either surface.

Partially polymerized sheets of methyl methacrylate based polymer having a thickness of 1.5 mm are prepared using cast polymerization of methyl methacrylate monomer, preferably dry, and benzoyl peroxide at a concentration of 0.2 weight percent at 60° C. for 12 hours in an oven. Partially polymerized polymer is removed from the polymerization cell and 5" discs are cut out. A new polymerization cell is formed between two 5" diameter polymer discs using a flexible gasket in the form of an O-ring. The sample cell is firmly secured between two optical flats. The cavity between the polymer sheets is filled with a solution containing 216 mg of the light harvesting dye 9,10-phenanthrenequinone in 30.64 g of MMA monomer, preferably dry, containing 61.7 mg of benzoyl peroxide as initiator. The whole assembly is held between two aluminum plates under pressure using a pneumatic device and transferred into an oven preheated to 60° C. The sample is allowed to polymerize at 60° C. for 24 hours followed by another 24 hours at 90° C. During the polymerization process, the inner walls of the polymer sheets begin to swell when they come in contact with the solution of the light harvesting dye in monomer allowing the light harvesting dye molecules to diffuse into the pure polymer sheets. As the polymerization progresses, diffusion of the light harvesting dye molecules into the polymer matrix slows down. This creates an exponentially decreasing concentration of the light harvesting dye molecules from the center of the sample towards the both outer surfaces.

EXAMPLE 6

216 mg of the light harvesting dye 9,10-phenanthrenequinone and 92.6 mg of benzoyl peroxide as polymerization initiator are dissolved in 30.64 g of MMA monomer, preferably dry. The solution is filtered and used to fill the polymerization cell described in Example 1. The polymerization is carried out in an oven at a temperature of 60° C. for 24 hours and at 90° C. for 24 hours. Samples are removed from the cells at room temperature and used to form new polymerization cells. They are formed between the above samples and the optical quality glass flats of similar dimensions on either side of the doped polymer sample using 3 mm thick flexible gasket as a spacer so that the doped polymer sheet is in the middle of the assembly. The cavity on either side of the polymer is filled with MMA monomer, preferably dry, containing 0.2% by weight of benzoyl peroxide polymerization initiator. The whole arrangement is then held between aluminum plates under pressure and kept in a preheated oven at 60° C. for polymerization. During polymerization, the light harvesting dye diffuses from the doped inner polymer layer into monomer layers on both sides of the doped polymer sheet to form the final material with an exponential distribution of the light harvesting dye across the thickness of the sample. The polymerization procedure for the preparation of the sample is as described in Example 5.

It is intended that the above description of the preferred embodiments of the structure of the present invention and description of its operation are but one or two enabling best mode embodiments for implementing the invention. Other modification and variations are likely to be conceived of by those skilled in the art upon reading of the preferred embodiments and a consideration of the appended claims and drawings. These modifications and variations still fall within the breadth and scope of the disclosure of the present invention.

We claim:

1. A method of fabricating a holographic recording medium comprising the steps of:

preparing an inner layer of at least two distinctive polymerizable acrylic materials
and a dye selected from the group consisting of:

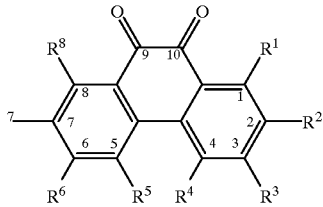

wherein $R^1$, $R^2$, $R^3$, $R^4$, $R^5$, $R^6$, $R^7$, $R^8$ is a H, $R^9$, or X; $R^9$ is an alkyl group having 1 to 8 carbon atoms, or an aryl group having 4 to 20 carbon atoms, and X is a halogen;

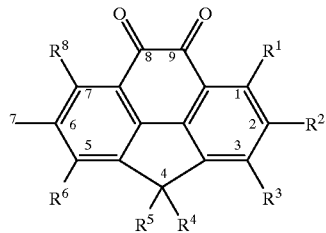

wherein $R^1$, $R^2$, $R^3$, $R^4$, $R^5$, $R^6$, $R^7$, $R^8$, is a H, $R^9$, or X; $R^9$ is an alkyl group having 1 to 8 carbon atoms, or an aryl group having 4 to 20 carbon atoms, and X is a halogen; and combinations thereof;
positioning the inner layer, which is at least partially polymerized, between two planar plates, each plate is separated from the other plate so there is a cavity between each plate and the inner layer;
inserting a third polymerizable acrylic material into the cavity;
heating the inner layer and the third polymerizable acrylic material to form a holographic recording medium having a concentration distribution of the dye.

2. The method of claim 1 wherein the at least two distinctive polymerizable acrylic materials and the third polymerizable acrylic material are selected from the group consisting of:

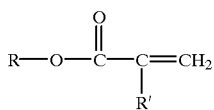

wherein R'=H; or an alkyl group having 1 to 8 carbon atoms; or an aryl group having 4 to 20 carbon atoms, R=an alkyl group having 1 to 8 carbon atoms, or an aryl group having 4 to 20 carbon atoms;

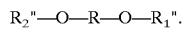

wherein R=an alkyl group having 1 to 8 carbon atoms; or an aryl group having 4 to 20 carbon atoms, $R_1"$ and $R_2"$=—OC(=O)C($R_3$)=$CH_2$ or H, wherein $R_3$=H, an alkyl group, having 1 to 8 carbon atoms; or an aryl group having 4 to 20 carbon atoms;

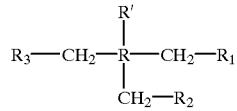

wherein R=a tri- or tetra-substituted aryl group; or a carbon atom;
R'=H, an alkyl group having 1 to 8 carbon atoms, or an aryl group having 4 to 20 carbon atoms, $R_1$, $R_2$, and $R_3$=—OC(=O)C($R_4$)=$CH_2$ or H wherein $R_4$=H, an alkyl group having 1 to 8 carbon atoms, or an aryl group having 4 to 20 carbon atoms; and

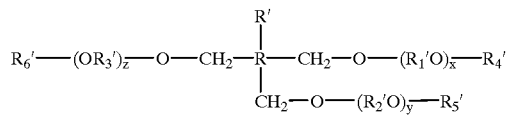

wherein R=a tri- or tetra-substituted aryl group; or a carbon atom;
R'=H, an alkyl group having 1 to 8 carbon atoms; or an aryl group having 4 to 20 carbon atoms, $R_1'$=$R_2$= $R_3'$=—$CH_2CH_2$— or —$CH_2CH_2CH_2$—, $R_4'$=R= $R_6'$=—OC(=O)C($R_7'$)=$CH_2$ or H wherein $R_7'$=H; or an alkyl having 1 to 8 carbon atoms; or an aryl group having 4 to 20 carbon atoms.

3. The method of claim 1 wherein the dye is 2-methyl-9,10-phenanthrenequinone.

4. The method of claim 1 wherein the dye is 9,10-phenanthrenequinone.

5. The method of claim 1 wherein the dye is 4H-cyclopenta[def]phenanthrene-8,9-dione.

6. The method of claim 1 wherein the dye is 4,4-dimethylcyclopenta[def]phenanthrene-8,9-dione.

7. The method of claim 1 wherein the dye comprises of 75 to 95 weight percent of 9,10-phenanthrenequinone and 25 to 5 weight percent of 9-iodophenanthrene.

8. The method of claim 1 wherein the dye is selected from the group consisting of 2-methyl-9,10-phenanthrenequinone, 9,10-phenanthrenequinone, 4H-cyclopenta[def]phenanthrene-8,9-dione, 4,4-dimethylcyclopenta[def]phenanthrene-8,9-dione, and combinations thereof.

9. The method of claim 1 wherein the ratio between each distinctive polymerizable acrylic material ranges from 1:99 to 99:1 percent by weight.

10. The method of claim 1 wherein the polymerization temperature ranges from 60° C. to 170° C.

11. The method of claim 1 wherein the dye is 0.2 to 5 weight percent of the monomer.

* * * * *